United States Patent
Grebs et al.

(10) Patent No.: US 6,211,550 B1
(45) Date of Patent: Apr. 3, 2001

(54) BACKMETAL DRAIN TERMINAL WITH LOW STRESS AND THERMAL RESISTANCE

(75) Inventors: Thomas Eugene Grebs; Rodney Sylvester Ridley, Sr., both of Mountaintop, PA (US); Jeffrey P. Spindler, Rochester, NY (US); Joseph Leonard Cumbo, West Wyoming, PA (US); Jeffrey Edward Lauffer, Mountaintop, PA (US)

(73) Assignee: Intersil Corporation, Palm Bay, FL (US)

( * ) Notice: Subject to any disclaimer, the term of this patent is extended or adjusted under 35 U.S.C. 154(b) by 0 days.

(21) Appl. No.: 09/339,356

(22) Filed: Jun. 24, 1999

(51) Int. Cl.$^7$ .......................... H01L 29/76; H01L 23/48; H01L 23/52; H01L 29/40

(52) U.S. Cl. .......................... 257/342; 257/761; 257/762; 257/763

(58) Field of Search .................................... 257/328, 342, 257/341, 761, 762, 763

(56) References Cited

U.S. PATENT DOCUMENTS 4,985,740 * 1/1991 Shenai et al. ..................... 257/341

FOREIGN PATENT DOCUMENTS 61-220344 * 9/1986 (JP) ..................................... 257/762

\* cited by examiner

*Primary Examiner*—Steven Loke
(74) *Attorney, Agent, or Firm*—Jaeckle Fleischmann & Mugel, LLP

(57) ABSTRACT

A semiconductor device includes a source region and a gate disposed at the upper surface of a silicon substrate, which includes a drain region for the device. On the lower surface of the substrate is disposed a backmetal drain terminal comprising a stack that includes a first layer of tantalum and an outermost second layer of copper.

14 Claims, 1 Drawing Sheet

US 6,211,550 B1

BACKMETAL DRAIN TERMINAL WITH LOW STRESS AND THERMAL RESISTANCE

FIELD OF THE INVENTION

The present invention relates to semiconductor device and, more particularly, to a backmetal drain terminal for a device on a thin silicon wafer.

BACKGROUND OF THE INVENTION

The manufacture of a semiconductor power device typically entails metallization of the backside of the silicon wafer to form a drain terminal. To maximize device performance, such backmetal films or film stacks must have low ohmic contact resistance and high thermal conductivity. To reduce the contribution of the substrate to overall operational resistance and to meet advanced packaging requirements, wafers for power devices are typically back thinned, frequently to less than 14 mils, which requires that the backmetal films on these thin wafers also have low tensile or compressive stress. Furthermore, device packaging considerations frequently require that the total combined thickness of the die and backmetal film stack be decreased and that the backmetal be solderable to allow solder mounting of the die on a lead frame.

Solderable backmetal stacks known in the art is typically comprise some combination of Ag, Al, Au, Cr, Ni, or Ti films, which all have varying stresses and thicknesses. The additive stress characteristics of unpatterned metal films have a significant effect on the overall stress induced on a wafer, causing considerable concave deformation, or warpage, of the wafer, and consequent wafer breakage in subsequent process operations. The effect of the backmetal stress on wafer bow increases in severity with increasing diameter and decreasing thickness of the wafer, trends that are ongoing in power device manufacturing.

There is a need for backmetal drain terminals with low resistance, high thermal conductivity, low tensile or compressive stress, and ready solderability to a frame. The present invention meets this need.

SUMMARY OF THE INVENTION

A semiconductor device includes a source region and a gate disposed at the upper surface of a silicon substrate, which includes a drain region for the device. On the lower surface of the substrate is disposed a backmetal drain terminal comprising a stack that includes a first layer of tantalum and an outermost second layer of copper.

DETAILED DESCRIPTION OF THE INVENTION

Figure 1:
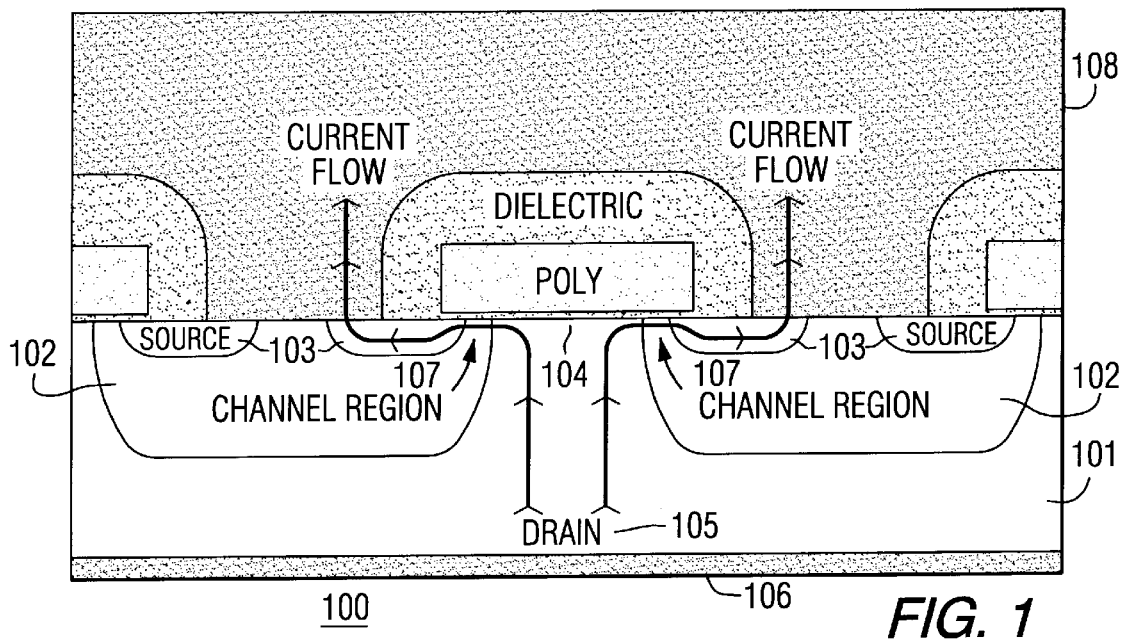
FIG. 1 depicts a double-diffused MOS (DMOS) semiconductor device provided with a backmetal drain terminal in accordance with the present invention.

In FIG. 1 is depicted a double-diffused MOS (DMOS) semiconductor device 100 comprising a silicon substrate 101 that includes well regions 102, source regions 103, and gate 104 at its upper surface. The lower portion of substrate 101 provides a drain region 105. FIG. 1 also shows the current flow from backmetal drain terminal 106 through substrate channel regions 107 and source regions 103 to source metal terminal 108.

Figure 2:
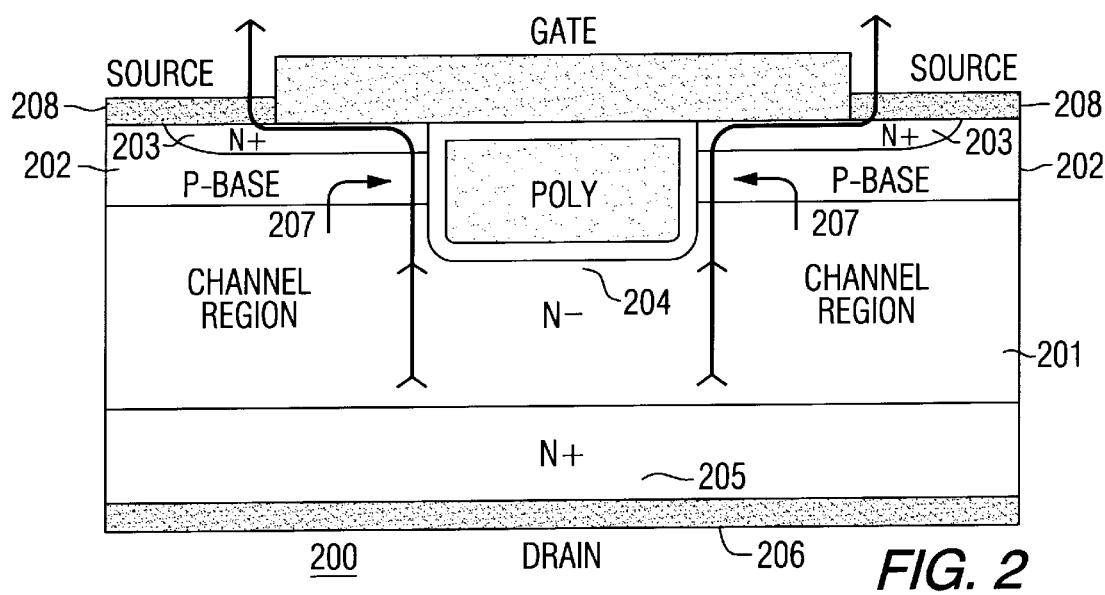
FIG. 2 depicts a U-shaped trench MOS (UMOS) semiconductor device provided with a backmetal drain terminal in accordance with the present invention.

FIG. 2 schematically illustrates a U-shaped trench MOS (UMOS) semiconductor device 200 comprising a silicon substrate 201 that includes base regions 202, source regions 203, and gate 204 at its upper surface. The lower portion of substrate 201 provides a drain region 205. Also shown in FIG. 2 is the flow of current from backmetal drain terminal 206 through substrate channel regions 207 and source regions 203 to source metal terminal 208.

The substrates 101 and 201 can be of either the N or P conductance type and can have a thickness of about 3–18 mils (75–450 µm), preferably less than about 14 mils (350 µm).

Figure 3:
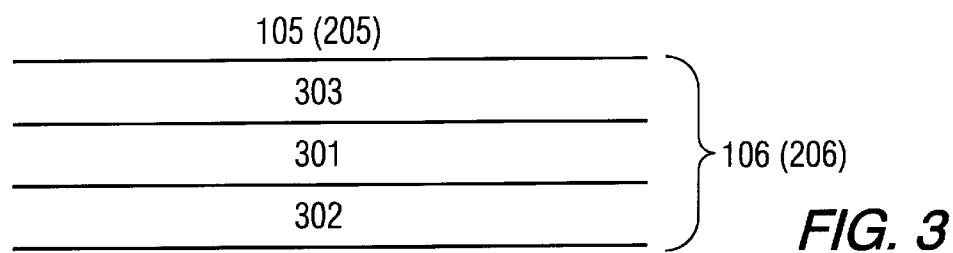
FIG. 3 is a schematic cross-section of the backmetal drain terminal of the present invention.

FIG. 3 illustrates in further detail the backmetal drain terminal 106 (206) adjacent the drain region 105 (205) of substrate 101 (201). Drain terminal 106 (206) includes a first layer 301 of tantalum, an outermost second layer 302 of copper, and an optional third layer 303 in contact with drain region 105 (205).

First layer 301 of tantalum and optional third layer 303, which preferably is formed of titanium, titanium silicide, or aluminum, each have a thickness preferably of about 500–3000 angstroms, more preferably, about 800–1200 angstroms. Outermost second layer of copper, which is solderable to a lead frame (not shown), has a thickness preferably of about 5000–15000 angstroms, more preferably, about 8000–12000 angstroms. First layer 301 and optional layer 303 prevent the diffusion of copper from second layer 302 into substrate 101 (201) during soldering, which typically is carried out at a temperature of about 350–400° C. For a substrate of N conductance type, titanium or titanium silicide is preferred for third layer 303. If the substrate is of P conductance type, aluminum is preferred for layer 303.

The metal layers 301, 302, and 303 comprising drain terminal 106 (206) can be formed on substrate 101 (201) by physical vapor deposition (PVD), or sputtering, as described in Wolf and Tauber, *Silicon Processing for the VLSI Era*, 1986, Lattice Press, Sunset Beach Calif., Vol. 1, Chapter 10, the disclosure of which is incorporated herein by reference.

In Table 1 are listed thermal and electrical conductivity, resistivity, and barrier height values for various metals that can be included in stacks employed as backmetal drain terminals. In general, high conductivity values and low resistivity values are desired for this purpose. The layer in contact with the silicon determines the contact resistance. For low on-resistance power devices, the metal contact to the silicon is required to have a low barrier height, where barrier height is proportional to contact resistance. A comparison of barrier height shows that titanium is the optimum metal for achieving lowest theoretical contact resistance, $R_{contact}$, tantalum being the next lowest. Although the use of tantalum in place of titanium would be expected to increase $R_{contact}$, it does not significantly change the total backside resistance, $R_{total}$. Moreover, the resistance attributed to any variation of metal films, $R_{metal}$, has minimal impact on total backside resistance, $R_{total}$. Since in most cases $R_{total}$ is dominated by the resistance of the substrate, $R_{silicon}$, thinning the substrate is necessary to remove as much silicon as possible. When wafers are thinned, however, they are susceptible to bow, stress, and warpage, especially with blanket backside metallization.

TABLE 1

| Element | Thermal conductivity (cal-cm/sK-cm$^2$) @ 20° C. | Electrical conductivity (10$^6$/ohm-cm) @ 20° C. | Resistivity (10$^{-6}$ ohm- cm) @ 20° C. | Barrier height (eV) |
|---|---|---|---|---|
| Ag | 1.000 | 0.625 | 1.600 | 0.780 |
| Al | 0.570 | 0.372 | 2.688 | 0.720 |
| Au | 0.700 | 0.430 | 2.326 | 0.800 |
| Cu | 0.940 | 0.599 | 1.669 | 0.580 |
| Ni | n/a | 0.146 | 6.84 | 0.61 |
| Ta | 0.130 | 0.081 | 12.346 | 0.580 |
| Ti | n/a | 0.024 | 41.667 | 0.500 |

Table 2 lists values for contact resistance ($R_{contact}$), metal resistance ($R_{metal}$), and silicon resistance ($R_{silicon}$), calculated by multiplying resistivities for the various metals by the thicknesses of the respective layers, for various comparative backmetal drain terminals as well as drain terminals of the present invention. The total resistance ($R_{total}$) values, which desirably are as low as possible, are the sums of $R_{contact}$, $R_{metal}$, and $R_{silicon}$. As can be seen from the entries in Table 2, the $R_{total}$ values for the comparison backmetal stacks and those of the present invention, each deposited on a 10-mil thick silicon wafer, are similar.

TABLE 2

| Backmetal film stacks | $R_{contact}$ (ohm - cm$^2$) | $R_{metal}$ (ohm - cm$^2$) | $R_{silicon}$* (ohm - cm$^2$) | $R_{total}$ = $R_c + R_m + R_{si}$ |
|---|---|---|---|---|
| Comparison | | | | |
| Al—Ti—Ni (5-3-10)** | 6.00 × 10$^{-4}$ | 2.07 × 10$^{-9}$ | 7.62 × 10$^{-5}$ | 6.76 × 10$^{-4}$ |
| Al—Ti—Ni—Au (30-3-10-1)** | 6.00 × 10$^{-4}$ | 2.76 × 10$^{-9}$ | 7.62 × 10$^{-5}$ | 6.76 × 10$^{-4}$ |
| Al—Ti—Ni—Ag (5-3-3.5-18)** | 6.00 × 10$^{-4}$ | 1.91 × 10$^{-9}$ | 7.62 × 10$^{-5}$ | 6.76 × 10$^{-4}$ |
| Ti—Ni—Ag (3-3.5-18)** | 1.00 × 10$^{-5}$ | 2.22 × 10$^{-9}$ | 7.62 × 10$^{-5}$ | 8.62 × 10$^{-5}$ |
| Invention | | | | |
| Ta—Cu (0.5-5)** | 6.00 × 10$^{-5}$ | 7.01 × 10$^{-10}$ | 7.62 × 10$^{-5}$ | 1.36 × 10$^{-4}$ |
| TiSi$_2$—Ta—Cu (1-0.5-5)** | 1.00 × 10$^{-5}$ | 1.46 × 10$^{-9}$ | 7.62 × 10$^{-5}$ | 8.62 × 10$^{-4}$ |
| Ti—Ta—Cu (1-0.5-5)** | 1.00 × 10$^{-5}$ | 3.27 × 10$^{-10}$ | 7.62 × 10$^{-5}$ | 8.62 × 10$^{-4}$ |

*based on Si resistivity = 0.003 ohm-cm (2 × 10$^{19}$ atoms/cm$^3$) @ 10 mil thickness
**×1000 angstroms = layer thickness Silicon wafer warpage is a function of the stress of the combination of backmetal films and can be measured by a Tencor FLX-2320 thin film stress measurement tool (available from Tencor Corporation, Milipitas, Calif.), which makes use of a radius of curvature measurement technique. The measurement of bow is assumed to be directionally proportional to the amount of stress in the backmetal stack. The wafer prior to backmetal deposition is under compressive stress and exhibits positive bow. The backmetal films measured produce tensile stress and exhibit negative bow; therefore it follows that wafer bow is proportional to the backmetal stress. Evidence of this proportionality is the net effect on wafer bow after backmetal deposition: it becomes more positive. Positive bow is relative to the placement of the wafer, which is always with the front or device side up during the bow measurement.

Bow measurements were made on a comparative Ti—Ni—Ag drain terminal and a Ta—Cu terminal of the present invention, described in Table 2 above, each formed on a silicon wafer having a thickness of 14 mils (350 μm) and a diameter of 200 mm. The results of the measurements were as follows:

| Drain Terminal | Bow (μm) |
|---|---|
| Ti—Ni—Ag (comparison) | 325 |
| Ta—Cu (invention) | 80 |

As shown by the above data, the bow measured for the Ta—Cu drain terminal, 80 μm, was far less than that observed for the comparative Ti—Ni—Ag structure, 325 μm. In general, a value above 300 μm is considered unacceptable in terms of increased risk of wafer breakage during processing. The measurements were made on 14 mil-thick wafers; the demonstrated advantage of the Ta—Cu drain terminal of the present invention would be expected to be even greater for thinner wafers.

In addition to the clearly beneficial reduction in stress, the backmetal drain terminals of the present invention provide manufacturing advantages related to cost of materials and throughput. As previously noted, the typical backmetal stack consists of three or more layers. One of these layers is usually a silver layer having a thickness of about 18000–20000 angstroms. The drain terminal of the present invention, with a copper layer having a thickness preferably of about 5000–15000 angstroms can be thinner than those of standard practice and typically requires one less metal film to be involved in the total backmetal combination. Thus, in addition to the advantage of replacing silver by much less expensive copper, the present invention enables increased throughput from a modular sputter deposition tool.

The present invention has been described in detail for the purpose of illustration, but it is understood that such detail is strictly for that purpose, and variations can be made therein by those skilled in the art without departing from the spirit and scope of the invention, which is defined by the following claims.

What is claimed:

1. A semiconductor device comprising a silicon substrate comprising a drain region, said substrate having disposed at an upper surface a source region and a gate and on a lower surface a backmetal drain terminal, wherein said drain terminal comprises a stack comprising a first layer consisting essentially of tantalum and an outermost second layer consisting essentially of copper.

2. The semiconductor device of claim 1 wherein said stack further comprises a third layer disposed between said substrate lower surface and said layer consisting essentially of tantalum.

3. The semiconductor device of claim 2 wherein said third layer comprises a material selected from the group consisting of titanium, titanium silicide, and aluminum.

4. The semiconductor device of claim 2 wherein said third layer has a thickness of about 500 angstroms to about 3000 angstroms.

5. The semiconductor device of claim 4 wherein said third layer has a thickness of about 800 angstroms to about 1200 angstroms.

6. The semiconductor device of claim 1 wherein said layer consisting essentially of tantalum has a thickness of about 500 angstroms to about 3000 angstroms.

7. The semiconductor device of claim 6 wherein said layer consisting essentially of tantalum has a thickness of about 800 angstroms to about 1200 angstroms.

8. The semiconductor device of claim 1 wherein said layer consisting essentially of copper has a thickness of about 5000 angstroms to about 15000 angstroms.

9. The semiconductor device of claim 8 wherein said layer consisting essentially of copper has a thickness of about 8000 angstroms to about 12000 angstroms.

10. The semiconductor device of claim 1 wherein said substrate has a thickness of about 3 mils (75 $\mu$m) to about 18 mils (450 $\mu$m).

11. The semiconductor device of claim 10 wherein said substrate has a thickness of less than about 14 mils (350 $\mu$m).

12. The semiconductor device of claim 10 wherein said substrate has a thickness of about 10 mils to about 14 mils.

13. The semiconductor device of claim 1 wherein said substrate is of an N conductance type.

14. The semiconductor device of claim 1 wherein said substrate is of a P conductance type.

* * * * *